(12) United States Patent
Lee et al.

(10) Patent No.: US 8,108,755 B2
(45) Date of Patent: Jan. 31, 2012

(54) METHOD AND APPARATUS OF CORRECTING ERROR DATA CAUSED BY CHARGE LOSS WITHIN NON-VOLATILE MEMORY DEVICE

(75) Inventors: Seung-won Lee, Seongnam-si (KR); Byeong-hoon Lee, Seoul (KR); Ki-hong Kim, Suwon-si (KR); Sun-kwon Kim, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 1044 days.

(21) Appl. No.: 12/010,244

(22) Filed: Jan. 23, 2008

(65) Prior Publication Data

US 2008/0195916 A1 Aug. 14, 2008

(30) Foreign Application Priority Data

Feb. 13, 2007 (KR) .................. 10-2007-0014988

(51) Int. Cl.
*G01F 11/10* (2006.01)
*G11C 29/00* (2006.01)

(52) U.S. Cl. ........................ 714/764; 714/819
(58) Field of Classification Search .................. 714/764, 714/819
See application file for complete search history.

(56) References Cited

U.S. PATENT DOCUMENTS

| | | | | |
|---|---|---|---|---|
| 5,563,824 | A * | 10/1996 | Miyawaki et al. | 365/185.18 |
| 5,768,193 | A | 6/1998 | Lee et al. | |
| 5,896,318 | A * | 4/1999 | Asada et al. | 365/185.24 |
| 5,963,473 | A | 10/1999 | Norman | |
| 6,510,072 | B2 * | 1/2003 | Kang | 365/145 |
| 6,560,143 | B2 * | 5/2003 | Conley et al. | 365/185.04 |
| 6,769,087 | B2 * | 7/2004 | Moro et al. | 714/763 |
| 6,819,589 | B1 * | 11/2004 | Aakjer | 365/185.02 |
| 6,982,904 | B2 * | 1/2006 | Shiga | 365/185.09 |
| 7,062,599 | B2 * | 6/2006 | Pistilli | 711/103 |
| 7,230,852 | B2 * | 6/2007 | Mitani et al. | 365/185.18 |
| 7,251,159 | B2 * | 7/2007 | Terzioglu | 365/185.03 |

(Continued)

FOREIGN PATENT DOCUMENTS

EP 1031993 A2 8/2000

*Primary Examiner* — Stephen Baker
(74) *Attorney, Agent, or Firm* — Harness, Dickey & Pierce, P.L.C.

(57) ABSTRACT

Example embodiments provide a method and apparatus of correcting error data due to charge loss within a non-volatile memory device including a plurality of memory cells. The method of correcting error data within the non-volatile memory devices may include detecting error data in a second data group by comparing a first data group read from memory cells in response to a first voltage with the second data group read from memory cells in response to a second voltage. The second voltage is higher than the first voltage. Error data in the first data group is detected by error-correcting code (ECC). Re-writing data in the memory cells is performed by correcting error data in the first data group and error data in the second data group. A central processing unit (CPU) may detect error in the second data group. The second data group may be read through a page buffer and compared with the first data group stored in a SRAM. The detected error may be updated to the page buffer. Error data in the first data group may be updated to the page buffer. The CPU corrects error in the final error data, and the page buffer rewrites the corrected data in the plurality of memory cells.

19 Claims, 3 Drawing Sheets

U.S. PATENT DOCUMENTS

| | | | |
|---|---|---|---|
| 7,450,425 B2 * | 11/2008 | Aritome | 365/185.19 |
| 7,486,530 B2 * | 2/2009 | Hartono et al. | 365/49.1 |
| 7,594,157 B2 * | 9/2009 | Choi et al. | 714/764 |
| 7,609,557 B2 * | 10/2009 | Aritome | 365/185.22 |
| 7,738,296 B2 * | 6/2010 | Lin | 365/185.11 |
| 7,797,480 B2 * | 9/2010 | Mokhlesi et al. | 711/103 |
| 7,954,037 B2 * | 5/2011 | Lasser et al. | 714/763 |

* cited by examiner

METHOD AND APPARATUS OF CORRECTING ERROR DATA CAUSED BY CHARGE LOSS WITHIN NON-VOLATILE MEMORY DEVICE

PRIORITY STATEMENT

This application claims the benefit of Korean Patent Application No. 10-2007-0014988, filed on Feb. 13, 2007, in the Korean Intellectual Property Office, the disclosure of which is incorporated herein in its entirety by reference.

BACKGROUND

1. Field

Example embodiments relate to a method and apparatus of correcting error data used in a non-volatile memory device, for example, to a method and apparatus of correcting error data caused by charge loss.

2. Description of the Related Art

A non-volatile memory device may retain stored data even when not powered. Examples of a non-volatile memory device may include flash memory, read-only memory, most types of magnetic computer storage (e.g., hard-disks, floppy disk drives, and magnetic tapes), and optical disc drives. For instance, flash memory, such as NAND, may be a type of flash memory capable of storing large amounts of data in a small area.

FIG. 1A illustrates a conventional memory cell of a non-volatile memory device. FIG. 1B illustrates a graph indicating the threshold voltage of a conventional non-volatile memory device. FIG. 1C illustrates a conventional memory cell of a non-volatile memory device when electrons are injected in the floating gate. Memory cells of a conventional non-volatile memory device may include a cell transistor having a control gate CG, a floating gate FG, a source, a substrate (bulk) and a drain.

Threshold voltage of a memory cell transistor within a non-volatile memory device defines the stored logic of the memory cell. For example, when a memory cell transistor is in its initial state (also called an erased state), the threshold voltage Vth may be relatively low. In this state, the memory cell transistor may be designated to have a logic value "1." On the other hand, when the memory cell transistor is in its programmed state, the threshold voltage Vth may be relatively high. This high threshold voltage state may be designated to have a logic value "0." Referring to FIG. 1B, the threshold voltage in the program state may be larger than 0, and the threshold voltage in the erase state may be smaller than 0.

The cell transistor of a memory cell may be programmed or erased by an F-N tunneling mechanism. F-N tunneling, or field emission, is the process whereby electrons tunnel through a barrier in the presence of a high electric field.

In order to change a memory cell transistor from its erased state to its programmed state through F-N tunneling, a voltage higher than the source voltage can be applied to the control gate CG. Referring to FIG. 1C, a relatively large positive potential difference is created between the control gate CG and the substrate (bulk), and excited electrons within the channel on the surface of the bulk are forced through and trapped in the floating gate FG. In other words, electrons may be injected into the floating gate FG. These negatively charged electrons act as a barrier between the control gate and the channel on the bulk, thereby increasing the threshold voltage of the memory cell transistor.

The memory cell can be brought back to its erased state by applying a voltage higher than a source voltage to the bulk. Thereby, forming a large negative potential difference between the control gate CG and the bulk. F-N tunneling draws the trapped electrons back, thus removing the electron barrier and decreasing the threshold voltage Vth.

FIG. 2 illustrates a programming operation of a conventional memory cell of a non-volatile memory device due to charge loss.

As time elapses, electrons injected into the non-volatile memory cell may be lost. Referring to FIG. 2, the electrons trapped in the floating gate FG are lost as time elapses. The result is fewer electrons within the floating gate FG. When electrons of the floating gate are lost, the threshold voltage of the non-volatile memory cell decreases. When electrons are lost, the threshold voltage may decrease As a result, the programmed state may be confused with the erase state thereby causing memory cell malfunctions.

SUMMARY

Example embodiments provide a method and apparatus of correcting error data due to charge loss within a non-volatile may include a plurality of memory cells. The method includes detecting error data in a second data group by comparing the first data group read from the plurality of memory cells in response to a first voltage with a second data group read from the plurality of memory cells in response to a second voltage, wherein the second voltage may be higher than the first voltage. Detecting error data in the first data group can be accomplished by error-correcting code (ECC). The error data maybe combined from the first data group and the second data group to a final data group. The corrected data may be re-written to the memory cells. The first voltage maybe a voltage distinguishing between a threshold voltage in a program state and a threshold voltage in an erase state of the plurality of memory cells.

According to example embodiments, a non-volatile memory device may include a CPU detecting error data in a second data group by comparing a first data group with the second data group and detecting error data in the first data group, and a page buffer storing the detected error data of the second data group. Before the CPU detects error data in a first data group, the first data group may be stored in a static random access memory (SRAM). The error data of the first data group may be selectively updated to the page buffer. The error data of the first data group is combined with the error data of the second data group into a final error data group, wherein the page buffer sends the corrected data to the plurality of memory cells.

BRIEF DESCRIPTION OF THE DRAWINGS

The above and other features and advantages will become more apparent by describing in detail example embodiments thereof with reference to the attached drawings in which.

DETAILED DESCRIPTION OF EXAMPLE EMBODIMENTS

Figures 1A, 1B, 1C:
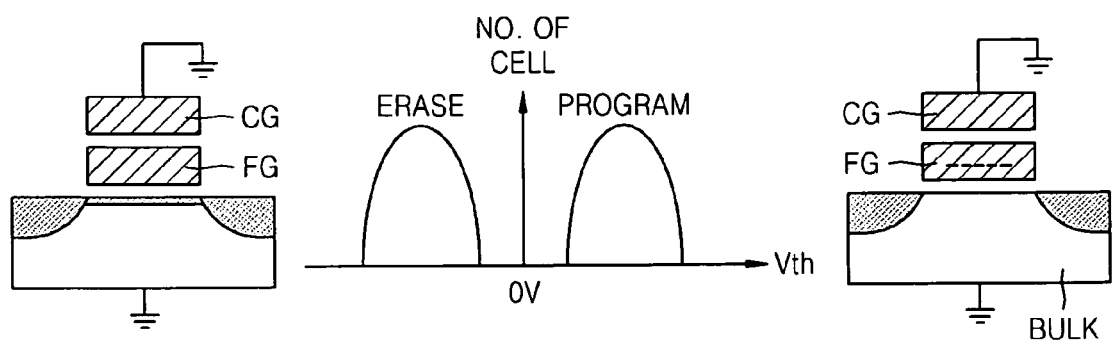
FIG. 1A illustrates a conventional memory cell of a non-volatile memory device.
FIG. 1B illustrates a graph indicating the threshold voltage of a conventional non-volatile memory device.
FIG. 1C illustrates a conventional memory cell of a non-volatile memory device when electrons are injected in the floating gate.
Figure 2:
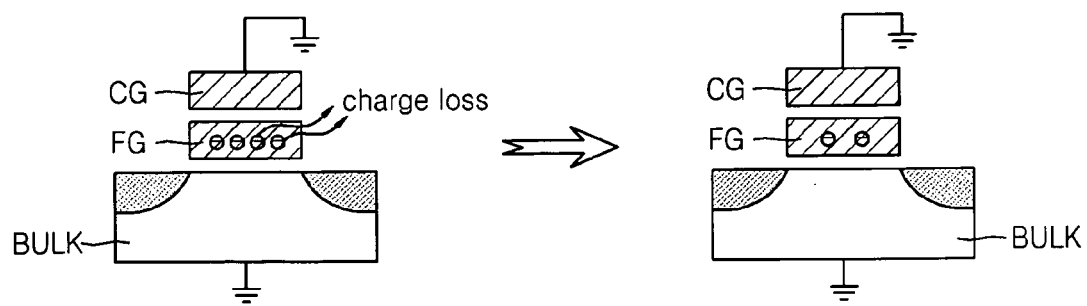
FIG. 2 illustrates a programming operation of a conventional memory cell of a non-volatile memory device.

Detailed example embodiments are disclosed herein. However, specific structural and functional details disclosed herein are merely representative for purposes of describing example embodiments. Accordingly, example embodiments are capable of various modifications and alternative forms. It should be understood, however, that there is no intent to limit example embodiments to the particular forms disclosed, but on the contrary, example embodiments are to cover all modifications, equivalents, and alternatives falling within the scope of the application. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used here, the term "and/or" includes any and all combinations of one or more of the associated listed items.

The terminology used herein is for the purpose of describing particular embodiments only and is not intended to be limiting. As used here, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments will now be described more fully with reference to the accompanying drawings. This invention, however, may be embodied in many different forms and should not be construed as limited to example embodiments set forth herein. Rather, example embodiments are provided so that this disclosure will be thorough and complete, and will fully convey the scope of the application to those skilled in the art. In the drawings, the thicknesses of layers and regions are exaggerated for clarity. Like numbers refer to like elements throughout.

Figure 3:
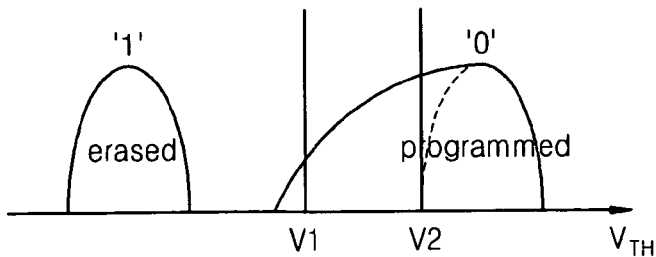
FIG. 3 illustrates a graph depicting a method of correcting error data caused by charge loss according to example embodiments of the present application.

FIG. 3 illustrates a graph depicting a method of correcting error data caused by charge loss according to example embodiments of the present application.

Figure 4:
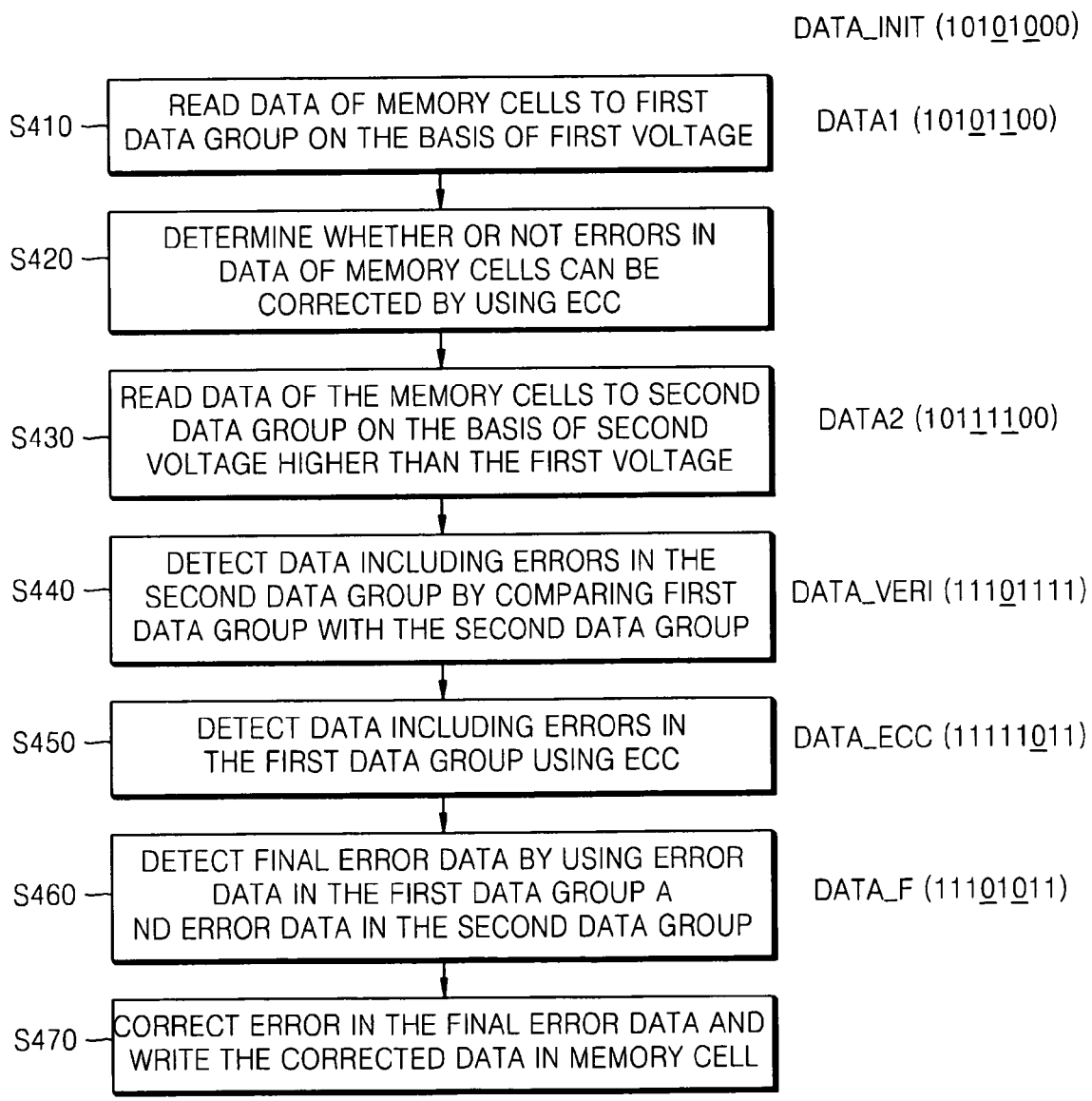
FIG. 4 illustrates a flowchart depicting a method of correcting error data caused by charge loss according to example embodiments of the present application.

FIG. 4 illustrates a flowchart depicting a method of correcting error data caused by charge loss according to example embodiments of the present application.

Referring to FIG. 4, a method of correcting error data according to an example embodiment of the present application includes detecting error data in a second data group by comparing a first data group with the second data group (operation S440), detecting error data in a first data group (operation S450), and re-writing data of memory cells (operation S470).

Figure 5:
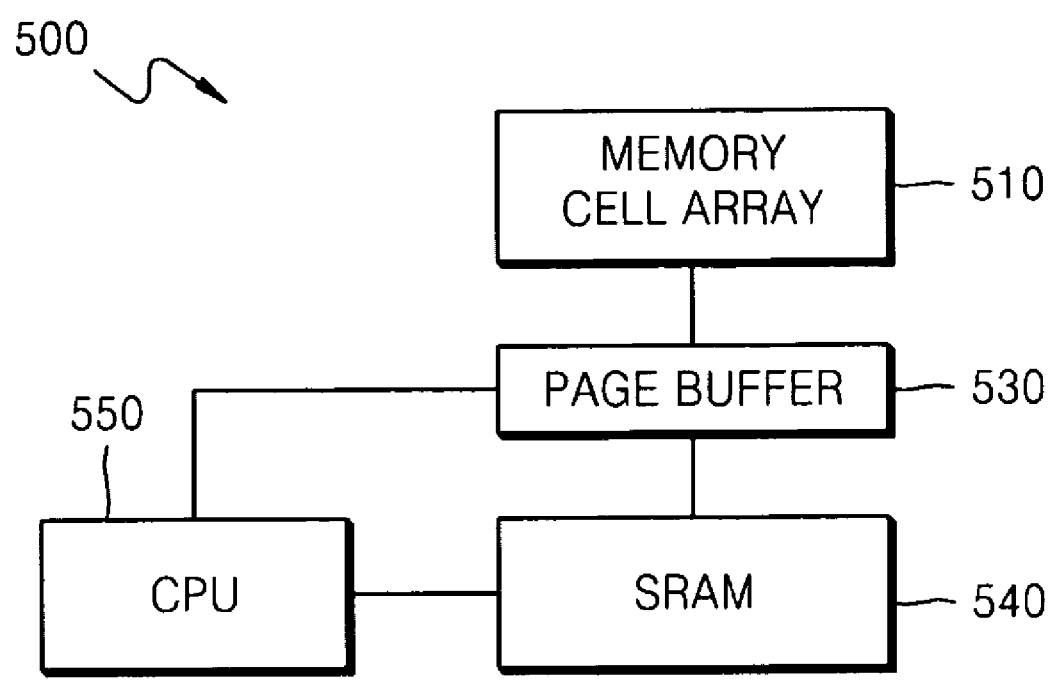
FIG. 5 illustrates a block diagram depicting a non-volatile memory device applying a method of correcting error data according to example embodiments of the present application.

Referring to FIGS. 4 and 5, an initial data group DATA_INIT is assumed to have the value '10101000'. DATA_INIT may be initially written to the memory cells. A first voltage V1 may be a voltage used to distinguish between a threshold voltage in a program state and a threshold value in an erase state of the memory cell.

In detecting error data in the second data group (operation S440), the first data group DATA1 may be read from memory cells in response to a first voltage V1 (operation S410) and the second data group DATA 2 may be read from memory cells in response to a second voltage V2 (operation S430). V2 may have a higher voltage than V1. Subsequently, the first data group DATA1 based on V1 may be compared to the second data group DATA2 based on V2. By comparing the first data group DATA 1 with the second data group DATA2, error data may be detected in the second data group DATA2.

Referring to FIG. 4, when the first data group DATA1 is read from memory cells in response to the first voltage V1 (operation S410), the first data group DATA1 is assumed to be '10101100'. When the second data group DATA2 is read from memory cells in response to the second voltage V2 (operation S430), the second data group DATA2 is assumed to be '10111100'. V2 may have higher voltage than V1. It is noted that the values used throughout the specification are for explanatory purposes only. However, other values may be used within the scope of the example embodiments. The first data group DATA1 may be compared with the second data group DATA2 (operation S440). In this example embodiment, the fourth data ('0') of the first data group DATA1 is different from fourth data ('1') of the second data group DATA2. Therefore, the fourth data is detected as error data. The remaining data of the first data group DATA1 and the second data group DATA2 are detected as normal data. The results (e.g., detected error data and normal data) may be output as a verification data group DATA_VERI.

In detecting error data in the second data group (operation S440), an inversion of exclusive OR of data in the first data group DATA1 and data in the second data group DATA2 may be performed.

In the verification data group DATA_VERI, the detected error data may be set to 0 and remaining normal data in the second data group to may be set to 1. In this particular example, the verification data group DATA_VERI is '11101111'. Therefore, the memory cell corresponding to the fourth data may be initially programmed to be 0. Because of charge loss, the threshold voltage may be decreased. The results of operation S440 depicted by verification data group DATA_VERI establish that the value of the data in the memory cell in response to the second voltage V2 may be 1.

In detecting error data in the second data group (operation S440), only error data on the basis of the first through second voltage V2 is detected. For instance, only data in a memory cell having a threshold voltage between the first and second voltages V1 and V2 may be detected as error data.

In an example embodiment of the present application, in detecting error data in the first data group (operation S450), an error-correcting code (ECC) operation may be used to detect error data in the first data group DATA1. In the ECC operation, a memory cell having a threshold voltage less than the first voltage V1 is detected. Accordingly, in detecting error data in the first data group (operation S450), a result of detecting error data may be output as an ECC data group DATA_ECC. For example, the ECC data group DATA_ECC may be '11111011'. In this particular example, the sixth data is 0. Therefore, the memory cell corresponding to the sixth data has a threshold voltage less than the first voltage V1.

The method of correcting error data according to an example embodiment of the present application may include detecting final error data (operation S460) by combining the error data in the first data group DATA1 (operation S450) and the error data in the second group DATA2 (operation S440). For example, in detecting final error data (operation S460), the fourth data and the sixth data that are determined as error data are represented as 0, and remaining data is represented as 1, so as to output a final data group DATA_F indicating locations of final error data. Correcting the error in the final data group DATA_F is performed, and the corrected data is re-written to the memory cells (operation S470).

In re-writing data of memory cells (operation S470), error data in the first data group DATA1 and error data in the second data group DATA2 are corrected to re-write data of the memory cells. For instance, the sixth data that is the error data in the first data group DATA1 and the fourth data that is the error data in the second data group DATA2 are corrected. In this particular example, the fourth data and the sixth data may be changed from 1 to 0.

The method of correcting error data according to the embodiment of the present invention may further include reading data of the memory cells to the first group on the basis of the first voltage (operation S410) and reading data of the memory cells to the second group on the basis of the second voltage higher than the first voltage (operation S430).

The method of correcting error data according to the embodiment of the present invention may further include determining whether errors in data of the memory cells can be corrected by using the ECC operation (operation S420).

According to another embodiment of the present application, the final data group DATA_F may be obtained by comparing the second data group DATA2 with the initial data group DATA_INIT. For example, when the initial data group DATA_INIT is assumed to be '10101000', and the second data group DATA2 is assumed to be '10111100', fourth data ('0') and sixth data ('0') of the initial data group DATA_INIT are different from fourth data ('1') and sixth data ('1') of the second data group DATA2, thus fourth and sixth data are detected as final error data. Therefore, the final data group DATA_F may be '11101011'.

FIG. 5 is a block diagram illustrating a non-volatile memory device applying the method of correcting error data according to an example embodiment of the present application.

Referring to FIGS. 4 and 5, in operation S410, the first data group DATA1 may be read through a page buffer 530 and stored in a static random access memory (SRAM) 540, or any similar memory device (e.g., data cache).

In operation S440, a central processing unit (CPU) 550 may detect error data in the second data group DATA2. The second data group DATA2 may be read through the page buffer 530 and compared with the first data group DATA1 stored in the SRAM 540. The detected error data may be updated to the page buffer 530. In other words, the verification data group DATA_VERI that represents error data in the second data group DATA2 may be updated to the page buffer 530.

In operation S450, error data in the ECC data group DATA_ECC that represents error data in the first data group DATA1 may be selectively updated to the page buffer 530. The verification data group DATA_VERI and the ECC data group DATA_ECC may be combined to produce a final data group DATA_F. The CPU 550 corrects error in the final error data, and the page buffer 530 sends the corrected data to the memory cell array 510.

As described above, the method of correcting error data according to example embodiments of the present application provides increased reliability of programming and erasing memory cells within a non-volatile memory device even when charge loss occurs.

While example embodiments have particularly shown and described with reference to FIGS. 4-5, it will be understood by those skilled in the art that various changes in form and details may be made therein without departing from the spirit and scope of this disclosure.

What is claimed is:

1. A method of correcting error data of a non-volatile memory device including a plurality of memory cells, the method comprising:
    detecting error data in a second data group by comparing a first data group read from the plurality of memory cells in response to a first voltage with the second data group read from the plurality of memory cells in response to a second voltage higher than the first voltage;
    detecting error data in the first data group;
    correcting error data in the first data group and the second data group; and
    re-writing the corrected error data in the plurality of memory cells.

2. The method of claim 1, wherein detecting error data in the first data group is performed using ECC (error-correcting code).

3. The method of claim 1, wherein detecting the error data in the second data group includes detecting error data as differences between the first data group and the second data group.

4. The method of claim 1, wherein detecting error data in the second data group includes performing an inversion of exclusive OR of data of the first data group and the second data group.

5. The method of claim 1, wherein detecting error data in the second data group sets the detected error data to 0, and remaining data in the second data group to 1.

6. The method of claim 1, wherein the first voltage is a voltage distinguishing between a threshold voltage in a program state and a threshold voltage in an erase state of the plurality of memory cells.

7. The method of claim 1, further comprising:
    detecting final error data by combining the error data in the first data group and the error data in the second data group;
    correcting the final error data; and
    writing the corrected data in the plurality of memory cells.

8. The method of claim 1, wherein detecting error data in the second group includes updating the detected error data to a page buffer in the non-volatile memory device.

9. The method of claim 8, wherein detecting error data in the first data group includes updating only the detected error data to the page buffer of the non-volatile memory device.

10. The method of claim 1, further comprising determining whether errors in data of the memory cells can be corrected by error-correcting (ECC).

11. The method of claim 1, wherein the non-volatile memory is a flash memory.

12. The method of claim 1, further comprising:
    reading data of the memory cells to the first data group in response to the first voltage; and
    reading data of the memory cells to the second data group in response to the second voltage.

13. The method of claim 12,
wherein reading data to the first data group includes storing the read first data group in a buffer, and
wherein detecting error data in the second data group includes comparing the read first data group stored in the buffer with the second data group.

14. The method of claim 13, wherein the buffer storing the first data group is an SRAM (static random access memory) or a data cache.

15. A method of correcting error data of a non-volatile memory device including a plurality of memory cells, the method comprising:
reading data from the memory cells to a data group in response to a second voltage, wherein the second voltage is higher than a first voltage;
the first voltage is a voltage distinguishing between a threshold voltage in a program state and a threshold voltage in an erase state of the plurality of memory cells;
detecting error data in the read data group by comparing the read data group and written data of the memory cells and updating the detected error data to a page buffer of the non-volatile memory device; and
correcting error data in the data group and re-writing data of the memory cells.

16. A non-volatile memory device comprising:
a CPU detecting error data in a second data group by comparing a first data group with the second data group, and detecting error data in the first data group;
a page buffer storing the detected error data of the second data group.

17. The non-volatile memory device of claim 16, wherein before the CPU detects error data in the first group, the first data group is stored in a static random access memory (SRAM).

18. The non-volatile memory device of claim 17, wherein the error data of the first group is selectively updated to the page buffer.

19. The non-volatile memory device of claim 18, wherein the error data of the first data group is combined with the error data of the second data group into a final error data group, and the page buffer sends a corrected data to the plurality of memory cells.

* * * * *